US008043662B2

(12) United States Patent
Orihashi

(10) Patent No.: US 8,043,662 B2
(45) Date of Patent: Oct. 25, 2011

(54) AQUEOUS SOLUTION FOR SURFACE TREATMENT OF METAL AND METHOD FOR PREVENTING DISCOLORATION OF METAL SURFACE

(75) Inventor: Masanori Orihashi, Ageo (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 825 days.

(21) Appl. No.: 11/507,221

(22) Filed: Aug. 21, 2006

(65) Prior Publication Data

US 2007/0042122 A1    Feb. 22, 2007

(30) Foreign Application Priority Data

Aug. 22, 2005    (JP) ................... 2005-240431

(51) Int. Cl.
*C25D 3/30* (2006.01)
*C25D 5/50* (2006.01)
(52) U.S. Cl. ............... 427/376.7; 205/300; 205/226
(58) Field of Classification Search ....... 205/775–794.5, 205/210, 220, 300; 204/400–435, 226, 85, 204/109, 101, 93; 427/328, 337; 106/1.25
See application file for complete search history.

(56) References Cited

U.S. PATENT DOCUMENTS

| 3,338,725 A * | 8/1967 | Banks ........................ 427/435 |
| 4,306,917 A * | 12/1981 | Oda et al. ................... 148/261 |
| 4,331,518 A * | 5/1982 | Wilson ........................ 205/253 |
| 4,992,259 A | 2/1991 | Schiraldi et al. |
| 5,470,636 A * | 11/1995 | Wakui et al. ................. 428/141 |
| 5,661,219 A * | 8/1997 | Nakane et al. ................ 525/166 |
| 6,319,543 B1 * | 11/2001 | Soutar et al. ................. 228/176 |
| 7,628,903 B1 * | 12/2009 | Tsuji et al. ................... 205/239 |
| 2002/0064676 A1 * | 5/2002 | Bokisa et al. ................. 428/645 |

FOREIGN PATENT DOCUMENTS

| CN | 1363552 | | 8/2002 |
| CN | 1515295 | | 7/2004 |
| JP | 57-82491 | | 5/1982 |
| JP | 57082491 A | * | 5/1982 |
| JP | 2004359996 A | * | 12/2004 |
| WO | WO 03/028716 | | 10/2003 |

OTHER PUBLICATIONS

Material Safety Data Sheet (MSDS), J.T. Baker pp. 1-7.*
JP57082491A, Ogawa K., 1982, English equivalent of abstract.*
JP2004359996A, Aoki et al., 2004, machine translation.*

* cited by examiner

*Primary Examiner* — Kaj K Olsen
*Assistant Examiner* — Susan Thai
(74) *Attorney, Agent, or Firm* — John J. Piskorski

(57) ABSTRACT

To provide a solder-plating film which has good solder wettability and with which discoloration and twisting of the tin film after heat treatment are prevented. A method and a solution for surface treating a tin film are disclosed. The aqueous solution contains specific compounds and is brought into contact with a tin-plating film before reflow treatment of the tin film.

4 Claims, No Drawings

AQUEOUS SOLUTION FOR SURFACE TREATMENT OF METAL AND METHOD FOR PREVENTING DISCOLORATION OF METAL SURFACE

The present invention relates to a solution for surface treating a metal, and particularly a tin-plating film; and to a method for surface treating a tin-plating film. In further detail, the present invention relates to a method whereby when a tin-plating method is used to form a tin film, a solution for surface treatment is applied to the surface of the tin-plating film before a reflow treatment is performed; and to a treatment solution used therewith.

Tin and tin alloy films have excellent bonding properties, low cost, electrical properties, and solderability; and are therefore widely used in parts that require electrical contact, such as chips, crystal oscillators, lead frames, printed circuits, and other electronic components, and as etching resists in steps involved in the manufacture of semiconductors and printed substrates.

Hair-like metal deposits called whiskers form over time on the surface of untreated tin and tin alloy plating. There is a possibility of electrical short circuiting when whiskers are formed on the surface of a tin or tin alloy film formed on the surface of substrates used in electronic components, or the like. It is well known that a high-temperature treatment; i.e., a reflow treatment, is performed after the tin or tin alloy film is formed in order to prevent the formation of such whiskers and to form a glossy tin or tin alloy film surface. However, there is a problem with the reflow treatment in that although the effect of preventing whisker generation is seen, discoloration and oxidation of the film surface following heating tend to occur. Oxidation of a film surface is regarded as a factor in discoloration of a plating film surface; film discoloration proceeds as the oxidized film becomes thicker; and oxidation of the plating film is also a cause for reduced solder wettability. Tin-lead alloy plating has been used in the past in response to such problems with films of tin, which is a metal that tends to oxidize. Lead has the effect of controlling oxidization of the tin and the growth of whiskers. However, the use of lead in electronic components is restricted due to the recent focus on lead toxicity. Therefore, there is a need for lead-free tin or tin alloy plating, and measures to prevent oxidation and whisker formation of plating films thereof are needed.

On the other hand, it is known that unlike with tin-lead alloy plating film, twisting tends to occur on the surface of tin-plating film as a result of reflow treatment. The term "twisting" here means undulating protrusions that appear in a tin film, and this twisting can form a wood grain pattern in some cases. This twisting on the film surface results in problems in that the thickness of the tin film is irregular, and depending on the case, the base material (for instance, nickel) is exposed, making it difficult to guarantee solderability. Therefore, it is necessary to prevent twisting of plating films.

A variety of solutions and methods for surface treating tin film have been used for years as methods for surface treating tin-plated steel sheets. For instance, JP (Kokai) 52-53739 discloses the surface treatment of a tin-plated steel sheet using an aqueous solution to which phosphoric acid or a combination of phosphoric acid and phosphorous acid or hypophosphoric acid has been added as free acid in the amount of 5 to 50 g/L. Moreover, according to this patent, the treatment bath is adjusted to a pH of 4 or less. This patent does not disclose using the compound or solution for surface treatment of the present invention before the reflow treatment.

JP (Kokoku) 58-1085 discloses a method for preventing the formation of a wood grain pattern on a tin-plating surface whereby an aqueous solution of an organic acid or salt thereof that has a melting point of 170° C. to 300° C. and will decompose with reflow is applied to the surface of a tin electroplated steel strip before the strip is subjected to the reflow treatment. Sodium gluconate, monosodium glutamate, sodium ethylenediamine tetraacetate (EDTA), and the like are cited as the organic acid or salt thereof in this patent. Moreover, according to this patent, the wood grain pattern on the tin-plating surface is not eliminated by sodium phosphate and this compound is inappropriate. This patent does not disclose the superior effects of the compounds used in the present invention or used with electronic components.

JP (Kokai) 7-286285 discloses an aqueous solution for chemical conversion treatment with a pH of 5.0 or less that contains phosphoric acid ions, an organophosphonic acid, and tin ions; and is used on the surface of tin-plated steel sheets. This patent discloses an aqueous chemical conversion solution whose essential component is an organophosphonic compound, and does not disclose the compounds of the present invention or the beneficial effects thereof.

An object of the present invention is to provide a plating film having good solder wettability and a method for forming same with which there is no twisting of the plating film, and discoloration is controlled, even after reflow treatment of a tin or tin alloy plating film used in electronic components.

The inventors conducted intense research of aqueous solutions for surface treating tin-plating films used before reflow treatment of the plating film in order to accomplish the above-mentioned object and, as a result, perfected the present invention upon discovering that specific compounds such as an ammonium salt of phosphoric acid have selective utility when compared to an aqueous solution containing other compounds with a similar structure. The aqueous solution for surface treatment of the present invention can yield a plating film of good solder wettability that will not discolor and with which twisting of the plated film is prevented.

A first aspect of the present invention is an aqueous solution for surface treating a tin-plating film containing an ammonium salt of phosphoric acid and having a pH of 3 to 5; an aqueous solution for surface treating a tin-plating film containing a salt of a polyphosphoric acid and having a pH of 2 to 10; an aqueous solution for surface treating a tin-plating film containing a salt of maleic acid and having a pH of 4.5 to 8.5; an aqueous solution for surface treating a tin-plating film containing L-arginine and having a pH of 7 to 12; an aqueous solution for surface treating a tin-plating film containing glycine and having a pH of 4 to 7; or an aqueous solution for surface treating a tin-plating film consisting of a mixture of an ammonium salt of phosphoric acid and a salt of a polyphosphoric acid, a mixture of glycine and an ammonium salt of phosphoric acid, or a mixture of glycine and a salt of a polyphosphoric acid.

A second aspect of the present invention is a method for surface treating a tin-plating film, wherein a tin film is treated with the above-mentioned aqueous solution for surface treating a tin-plating film.

A third aspect of the present invention is a method for surface treating a tin-plating film, wherein tin plating is performed to form a tin film on the surface of a substrate, and the surface of the tin film is then treated with the above-mentioned aqueous solution for surface treating a tin-plating film.

A fourth aspect of the present invention is a method for forming a tin-plating film on a metal, including the steps of preparing a substrate that has a metal on the surface; activating the substrate with an acid; tin plating the activated substrate; treating the tin-plating film with an aqueous solution for surface treatment; and subjecting the tin film to a reflow treatment, wherein the aqueous solution for surface treatment is the above-mentioned aqueous solution for surface treating a tin-plating film.

A fifth aspect of the present invention is a method for producing an electronic part having a tin film including the step of treating the surface of the tin film with the above-mentioned aqueous solution for surface treating a tin-plating film between the step for tin plating a substrate and the step for subjecting the substrate having the tin film to a reflow treatment.

The abbreviations used throughout the present specification have the following definitions unless otherwise indicated: g=gram, mg=milligram; °C.=degrees Celsius; V=volt, A=ampere, m=meter; cm=centimeter; μm=micrometer, L=liter; mL=milliliter; and dm$^2$=square decimeter. All of the numeric ranges include the boundary values and can be combined in any order.

The terms "plating solution" and "plating bath" in the present specification have the same meaning and are used interchangeably.

The aqueous solution for surface treating a tin-plating film contains water and one or more compounds selected from the group consisting of ammonium salts of phosphoric acid, salts of polyphosphoric acids, and salts of glycine, L-arginine, and maleic acid.

Although not restricted to these, examples of the salts of polyphosphoric acids and salts of maleic acid of the present invention are ammonium salts and sodium, potassium, and other alkali metal salts.

The one or more compounds selected from the group consisting of ammonium salts of phosphoric acid, salts of polyphosphoric acids, and salts of glycine, L-arginine, and maleic acid are present as a compound in the aqueous solution for surface treatment in an amount within the range of 5 to 100 g/L, preferably 10 to 80 g/L, and particularly 30 to 60 g/L.

The aqueous solution for surface treating a tin-plating film of the present invention has an optimal pH range that is predetermined in accordance with the components thereof. For example, the pH is 3 to 5, and preferably within a range of greater than 4 to 4.5, when the solution contains an ammonium salt of phosphoric acid; the pH is within a range of 7 to 12 when L-arginine is used; the pH is within a range of 6 to 9 in the case of maleic acid; the pH is within a range of 2 to 10, and preferably 6 to 10, in the case of a salt of a polyphosphoric acid; and the pH is within a range of 4 to 7 in the case of glycine. Moreover, the pH of the aqueous solution is 4 to 7, and preferably 5 to 6 when it contains a mixture of an ammonium salt of phosphoric acid and a salt of a polyphosphoric acid; the pH of the aqueous solution is preferably 4 to 6, and particularly 4 to 5, when it contains a mixture of an ammonium salt of phosphoric acid and glycine; and the pH of the aqueous solution is preferably 7 to 9, and particularly 7 to 8, when it contains a mixture of a salt of a polyphosphoric acid and glycine. A conventional pH regulator can be used to adjust the pH. For instance, phosphoric acid or acetic acid can be used to lower the pH, while aqueous ammonia, sodium hydroxide, or potassium hydroxide can be added to raise the pH. In the preferred embodiments, the pH of the aqueous solution is adjusted by the acid or alkali constituting the components contained in the solution. For instance, it is preferred that when the solution contains the ammonia salt of phosphoric acid the pH of the aqueous solution is adjusted with phosphoric acid or ammonia. Moreover, it is preferred that when the solution contains a salt of polyphosphoric acid, the pH of the aqueous solution is adjusted with polyphosphoric acid or the alkali component that constitutes the salt. Furthermore, when the solution contains a salt of maleic acid, it is preferred that the pH of the aqueous solution is adjusted with maleic acid or the alkali component that constitutes the salt.

The aqueous solution for surface treatment of the present invention is generally used within a bath temperature range of 10° C. to 100° C., preferably room temperature (25° C.) to 70° C., and ideally 40° C. to 70° C.

Conventional additives, such as surfactants, antibacterial agents, and solvents, can be added to the present invention as needed, but are essentially unnecessary.

The agent for surface treating a tin-plating film of the present invention can be applied to a substrate by conventional methods, such as immersion treatment or spray treatment. In general, the surface of the tin film is washed with water and then the solution for surface treating a tin-plating film of the present invention is applied by immersion or spraying. Treatment time is generally from 5 to 120 seconds, and preferably from 10 to 60 seconds. The product is then generally treated by being rinsed, washed with pure water, and dried in succession.

The treatment solution of the present invention is ideal for treating the tin-plating film of electronic components, or the like. Examples of such components include chip resistors, chip capacitors, and other chip components; connector pins; bumpers; printed boards; lead frames; and other electronic components.

As will become clear from the working examples, the compounds used in the present invention; specifically, phosphoric acid, salts of polyphosphoric acids, and salts of glycine, L-arginine, and maleic acid, have an obvious effect when compared to other similar compounds. That is, when a tin-plating film is surface treated with the solution for surface treatment of the present invention prior to reflow treatment, discoloration and twisting of the film surface can be controlled and a tin-plating film can be formed that has good solder wettability, even after reflow treatment.

The present invention will now be described in specific terms using working examples and comparative examples.

Appearance, discoloration, and twisting were evaluated as follows in the working examples and comparative examples.

(1) Appearance

A tin-plating film treated with a solution for surface treatment was subjected to a reflow treatment and dried. Then the surface of the tin-plating film was checked macroscopically for gloss and uniformity of plating appearance (anomalies in appearance) were evaluated according to four levels.

1: Glossy and uniform: Glossy, uniform film
2: Glossy, irregular: Glossy, but irregular film
3: Dull, uniform: Dull, but uniform film
4: Dull, irregular: Dull, irregular film (2) Discoloration Tin-plating films that had been treated with a solution for surface treatment were subjected to a reflow treatment and dried. The surface of the tin-plating film was then checked macroscopically for discoloration and evaluated according to four levels.

Excellent: No discoloration
Good: Virtually no discoloration (very glossy)
Average: Slight white, gray, yellow, or other discoloration.
Poor: Brown or violet discoloration.

(3) Twisting

Tin-plating films that had been treated with a solution for surface treatment were subjected to a reflow treatment and dried. The surface of the tin-plating film was then checked macroscopically for twisting and evaluated according to four levels.

Excellent: No twisting
Good: Virtually no twisting
Average: Slight twisting
Poor: Twisting

WORKING EXAMPLES 1 THROUGH 4 AND
COMPARATIVE EXAMPLES 0 THROUGH 38

A copper lead frame was subjected to cathodic electrolytic degreasing under a voltage of 4 V for one minute in an alkali electrolytic degreasing agent (Cleaner 160P, Meltex Inc.) solution at a bath temperature of 60° C.; the product was rinsed with water; chemical abrasion was performed by immersion for 30 seconds in a solution of a persulfate chemical abrasion agent (Actronal 55) at room temperature; the product was rinsed with water, acid washed in 10% sulfuric acid solution, and rinsed with water; nickel plating was performed in an additive-free Watts bath at a temperature of 55° C. and current density of 3 A/dm$^2$×two minutes to form a nickel film with a thickness of 1 μm; the product was rinsed with water; a tin-plating film with a thickness of 3 μm was formed by a conventional methanesulfonic acid tin-plating bath (SOLDERON™ TMBT-280 tin plating); and the product was rinsed with water, immersed for 30 seconds in an aqueous solution with the composition and pH shown in Table 1 at 25° C., rinsed with water, and dried. The sodium polyphosphate was made by Kanto Chemical Co., Inc. After drying, a reflow treatment was performed under conditions of 260° C. for one minute with a reflow device (RF-330 made by Japan Pulse Laboratories, Inc.), and the appearance, discoloration, and twisting of the tin film at each part were evaluated. The evaluation results are shown in Table 1.

TABLE 1

| | Compound | Content | pH | Appearance | Discoloration | Twisting |
|---|---|---|---|---|---|---|
| Working Examples | | | | | | |
| 1 | Monoammonium phosphate | 50 | 4.21 | 1 | Good | Good |
| 2 | Sodium polyphosphate | 50 | 7.95 | 1 | Average | Good |
| 3 | L-arginine | 50 | 11.67 | 1 | Average | Good |
| 4 | Glycine | 50 | 6.17 | 1 | Average | Good |
| Comparative Examples | | | | | | |
| 0 | Untreated | n/a | | 1 | Poor | Poor |
| 1 | Diammonium phosphate | 50 | 7.95 | 4 | Average | Average |
| 2 | Triammonium phosphate | 50 | 9.68 | 1 | Average | Poor |
| 3 | Ammonium sodium phosphate dibasic tetrahydrate | 50 | 8.13 | 1 | Average | Average |
| 4 | Potassium hydrogen phosphate | 50 | 4.63 | 4 | Average | Poor |
| 5 | Dipotassium hydrogen phosphate | 50 | 9.18 | 4 | Average | Average |
| 6 | Trisodium phosphate | 50 | ≧12 | 1 | Average | Average |
| 7 | Phosphoric acid | 50 | 1.07 | 4 | Average | Average |
| 8 | Methanesulfonic acid | 50 | 1 | 1 | Average | Poor |
| 9 | Sodium tripolyphosphate | 50 | 9.28 | 4 | Average | Average |
| 10 | Phosphinic acid | 50 | 1.04 | 4 | Poor | Poor |
| 11 | Sodium pyrophosphate | 50 | 10.95 | 1 | Average | Average |
| 12 | Sodium metaphosphate | 50 | 6.06 | 1 | Average | Average |
| 13 | Sodium hexametaphosphate | 50 | 5.96 | 1 | Poor | Poor |
| 14 | Lactic acid | 50 | 2 | 1 | Poor | Poor |
| 15 | Citric acid | 50 | 1.82 | 4 | Poor | Poor |
| 16 | Citric acid monohydrate | 50 | 1.81 | 4 | Average | Average |
| 17 | Dipotassium citrate | 50 | 4.94 | 1 | Poor | Poor |
| 18 | Tripotassium citrate | 50 | 8.25 | 1 | Poor | Poor |
| 19 | Ammonium citrate | 50 | 4.89 | 4 | Average | Poor |
| 20 | Malonic acid | 50 | 2.27 | 4 | Average | Average |
| 21 | Itaconic acid | 50 | 2.27 | 4 | Average | Average |
| 22 | Alanine | 50 | 6.17 | 1 | Average | Poor |
| 23 | L-aspartic acid | 50 | ≧12 | 1 | Poor | Average |
| 24 | Nicotinic acid | 50 | 5.89 | 1 | Average | Poor |
| 25 | Malic acid | 50 | 1.18 | 4 | Poor | Poor |
| 26 | Nitrilotriacetic acid | 50 | 3.89 | 1 | Poor | Poor |
| 27 | Tartaric acid | 50 | 1.67 | 1 | Poor | Poor |
| 28 | Iminodiacetic acid | 50 | 3.06 | 1 | Poor | Poor |
| 29 | Succinic acid | 50 | 2.27 | 4 | Average | Poor |
| 30 | Potassium sorbate | 50 | 8.25 | 1 | Average | Average |
| 31 | Sodium gluconate | 50 | 6.82 | 1 | Average | Poor |
| 32 | Acetic acid | 50 | 2.36 | 4 | Poor | Average |
| 33 | Ammonia | 50 | ≧12 | 1 | Average | Poor |
| 34 | Picolinic acid | 50 | 3.17 | 1 | Poor | Poor |
| 35 | Boric acid | 50 | 3.65 | 1 | Poor | Poor |
| 36 | Ammonium thiocyanate | 50 | 4.98 | 1 | Poor | Poor |
| 37 | L-ascorbic acid | 50 | 2.34 | 1 | Poor | Poor |
| 38 | Ammonium sulfite | 50 | 8.19 | 1 | Poor | Poor |

It was confirmed that the aqueous solution for surface treatment prepared from the compounds used in the working examples reduced discoloration and twisting of the tin-plating film that had been subjected to reflow treatment in contrast to the aqueous solutions of the comparative examples.

The compounds in Working Examples 1 through 4, or the aqueous solution for surface treatment prepared using a salt of maleic acid, were evaluated as in Working Example 1 under the treatment conditions shown in Table 2. Fifty grams/liter of the compounds in Working Examples 1 through 4 or maleic acid were added to water; the pH was adjusted using phosphoric acid or ammonia for the aqueous monoammonium phosphate solution, phosphoric acid or sodium hydroxide for the aqueous sodium polyphosphate solution, acetic acid or sodium hydroxide for the aqueous maleic acid or L-arginine solution, and acetic acid or ammonia for the aqueous glycine solution; and optimal pH tests were conducted on each of the aqueous solutions for surface treatment. At the same time, the bath temperature was varied between 25° C. and 60° C., which is believed to reflect a temperature range that is normally used for the bath temperature, and the effect of temperature was also studied.
The evaluation results are shown in Table 2.

L-arginine provided good results in terms of appearance, discoloration and twisting when the pH was 4 to 9, as shown in Working Examples 3 [sic], 18, and 19.

Although maleic acid did not provide good results in terms of "twisting" when the pH was 4 or 9, as shown in Comparative Examples 41 and 42, it did provide good results in terms of each property under a pH of 6, as in Comparative Examples 41 and 42.

The solution for surface treating a tin film of the present invention was prepared as in Table 3 using two compounds and evaluated as in Working Example 1. The bath temperature of the aqueous solution for surface treatment was 40° C.

TABLE 2

| Comparative Example | Compound | pH | Bath temperature ° C. | Appearance | Discoloration | Twisting |
|---|---|---|---|---|---|---|
| 5 | Monoammonium phosphate | 4.3 | 25 | 1 | Good | Good |
| 6 | Monoammonium phosphate | 4.3 | 40 | 1 | Excellent | Good |
| 7 | Monoammonium phosphate | 4.3 | 60 | 1 | Excellent | Excellent |
| Comparative Example 39 | Monoammonium phosphate | 2 | 25 | 4 | Average | Average |
| Comparative Example 40 | Monoammonium phosphate | 6 | 25 | 1 | Average | Poor |
| 8 | Sodium polyphosphate | 2 | 25 | 1 | Average | Good |
| 9 | Sodium polyphosphate | 6 | 25 | 1 | Excellent | Excellent |
| 10 | Sodium polyphosphate | 8 | 40 | 1 | Excellent | Good |
| 11 | Sodium polyphosphate | 8 | 60 | 1 | Excellent | Good |
| 12 | Sodium polyphosphate | 10 | 25 | 1 | Excellent | Good |
| 13 | Sodium polyphosphate | 10 | 40 | 1 | Excellent | Excellent |
| 14 | Glycine | 6.2 | 40 | 1 | Excellent | Excellent |
| 15 | Glycine | 6.2 | 60 | 1 | Excellent | Excellent |
| 16 | Glycine | 4 | 25 | 1 | Excellent | Good |
| 17 | Glycine | 9 | 25 | 1 | Average | Good |
| 18 | L-arginine | 12 | 40 | 1 | Excellent | Excellent |
| 19 | L-arginine | 12 | 60 | 1 | Excellent | Good |
| Comparative Example 41 | Maleic acid | 4 | 25 | 1 | Excellent | Average |
| 20 | Maleic acid | 6 | 25 | 1 | Excellent | Good |
| Comparative Example 42 | Maleic acid | 9 | 25 | 1 | Excellent | Average |

TABLE 3

| Comparative Example | | | pH | Appearance | Discoloration | Twisting |
|---|---|---|---|---|---|---|
| 24 | Monoammonium phosphate 25 g/L | Glycine 25 g/L | 4.65 | 1 | Excellent | Excellent |
| 25 | Monoammonium phosphate 25 g/L | Sodium polyphosphate 25 g/L | 5.86 | 1 | Excellent | Excellent |
| 26 | Glycine 25 g/L | Sodium polyphosphate 25 g/L | 7.81 | 1 | Excellent | Good |

The ammonium salt of phosphoric acid provided good results in terms of "twisting" when the pH was 2 and 6 (Comparative Examples 39 and 40), but also yielded good results in terms of appearance, discoloration, and twisting when the pH was 4.21 to 4.3, as shown in Working Examples 1 and 5 through 7. Moreover, good results were seen within a temperature range of 25° C. to 60° C.

Moreover, sodium polyphosphate provided good results in terms of appearance, disscoloration, and twisting when the pH was 2 to 10, as shown in Working Examples 2 and 8 through 13. These good results were seen within a temperature range of 25° C. to 60° C.

Glycine provided good results in terms of appearance, discoloration and twisting when the pH was 4 to 9, as shown in Working Examples 4 and 14 through 17. These good results were seen within a temperature range of 25° C. to 60° C.

WORKING EXAMPLES 27 AND 28 (SOLDER WETTABILITY TEST)

Lead frames subjected to a tin-film surface treatment were prepared under the same conditions as in Working Examples 1 and 5, with the exception that 60° C. was used for the treatment temperature of the aqueous solution for surface treatment in Working Examples 1 and 5. The resulting lead frames were subjected to moisture-resistance testing at 105° C. and 100% RH for four and eight hours (PCT (105° C., 100% RH 4 or 8 hours)), and the solder wettability of the plating film after moisture-resistance testing was evaluated by measuring the zero cross time by the meniscograph method using the SAT-5000 Solder Checker (RHESCA Co., Ltd.). The measurement conditions were as follow.

Zero cross time measurement conditions

| | |
|---|---|
| Solder bath: | Sn/Pb = 63/37 |
| Bath temperature: | 235° C. |
| Immersion depth: | 1 mm |
| Immersion speed: | 10 mm/second |
| Immersion time: | 5 seconds |
| Flux: | Inactivated rosin |

Table 4 shows the results obtained by the above-mentioned test.

TABLE 4

| Tin plating current density | Treatment solution | Solder wettability after moisture resistance testing | | |
|---|---|---|---|---|
| A/dm$^2$ | | After treatment | PCT 4 hr | PCT 8 hr |
| 5 | Working Example 1 | 0.2 sec | 0.3 sec | 1 sec |
| 5 | Working Example 5 | 0.2 sec | 0.3 sec | 1.1 sec |
| 15 | Working Example 1 | 0.2 sec | 0.3 sec | 0.3 sec |
| 15 | Working Example 5 | 0.2 sec | 0.3 sec | 0.3 sec |
| 20 | Working Example 1 | 0.2 sec | 0.3 sec | 0.4 sec |
| 20 | Working Example 5 | 0.2 sec | 0.3 sec | 0.3 sec |

The tin-plating time was adjusted for each current density so that the plating film thickness would be consistent. The aqueous solution for surface treatment in Working Examples 1 and 5 provided good solder wettability.

According to the tin-plating film surface treatment solution of the present invention, it is possible to form a film with excellent corrosion resistance and twisting resistance. That is, it is possible to reduce discoloration of a tin film after heating and to form a tin film having good solderability by using the surface-treatment solution of the present invention before subjecting a tin-plating film to reflow treatment.

What is claimed is:

1. A method for forming a tin-plating film on a metal comprising the steps of:
   a) preparing a substrate that has a metal on its surface;
   b) activating the substrate with an acid;
   c) tin plating the activated substrate to form a tin film on the substrate;
   d) treating the tin film with an aqueous solution for surface treatment comprising a salt of maleic acid with a pH of 4.5 to 8.5, L-arginine with a pH of 7 to 12, glycine with a pH of 4 to 7, or a mixture of glycine and a salt of polyphosphoric acid; and
   e) after the surface treatment, subjecting the tin film to a reflow treatment.

2. The method of claim 1, wherein the pH of the mixture of: glycine and the salt of polyphosphoric acid is 4 to 6 and the salt of the polyphosphoric acid is an ammonium salt.

3. The method of claim 1, wherein the pH of the mixture of glycine and a salt of a polyphosphoric acid is 7 to 9.

4. The method of claim 1, wherein the L-arginine is included in the aqueous surface treatment solution in amounts of 30 g/L to 60 g/L.

* * * * *